US008832326B1

(12) United States Patent
Fischaber

(10) Patent No.: US 8,832,326 B1
(45) Date of Patent: Sep. 9, 2014

(54) CIRCUIT AND METHOD FOR ORDERING DATA WORDS

(75) Inventor: Thomas E. Fischaber, Golden, CO (US)

(73) Assignee: Xilinx, Inc., San Jose, CA (US)

( * ) Notice: Subject to any disclaimer, the term of this patent is extended or adjusted under 35 U.S.C. 154(b) by 1615 days.

(21) Appl. No.: 11/264,555

(22) Filed: Nov. 1, 2005

(51) Int. Cl.
*G06F 13/10* (2006.01)

(52) U.S. Cl.
USPC .................................. 710/8; 710/72

(58) Field of Classification Search
None
See application file for complete search history.

(56) References Cited

U.S. PATENT DOCUMENTS

| 4,860,199 | A | * | 8/1989 | Langendorf et al. .......... 711/213 |
| 5,414,377 | A | * | 5/1995 | Freidin ........................... 326/41 |
| 5,587,921 | A | * | 12/1996 | Agrawal et al. ................. 716/16 |
| 6,086,629 | A | * | 7/2000 | McGettigan et al. ........... 716/12 |
| 6,262,597 | B1 | * | 7/2001 | Bauer et al. ..................... 326/41 |
| 6,323,682 | B1 | * | 11/2001 | Bauer et al. ..................... 326/41 |
| 6,434,662 | B1 | * | 8/2002 | Greene et al. ................. 711/108 |
| 6,457,058 | B1 | * | 9/2002 | Ullum et al. .................. 709/238 |
| 6,505,337 | B1 | * | 1/2003 | Wittig et al. .................... 716/17 |
| 6,700,809 | B1 | * | 3/2004 | Ng et al. ....................... 365/49.1 |
| 6,735,670 | B1 | * | 5/2004 | Bronstein et al. ............. 711/108 |
| 7,028,281 | B1 | * | 4/2006 | Agrawal et al. ................. 716/12 |
| 7,061,407 | B1 | * | 6/2006 | Lee ................................. 341/50 |
| 7,069,363 | B1 | * | 6/2006 | Worrell ......................... 710/110 |
| 7,085,858 | B1 | * | 8/2006 | Fox et al. ......................... 710/13 |
| 7,183,796 | B2 | * | 2/2007 | Leijten-Nowak ............... 326/38 |
| 7,224,183 | B2 | * | 5/2007 | Baeckler et al. ................ 326/38 |
| 7,290,196 | B1 | * | 10/2007 | Annayya et al. .............. 714/758 |
| 7,443,846 | B1 | * | 10/2008 | Metzgen ....................... 370/389 |
| 7,460,534 | B1 | * | 12/2008 | Bellenger ..................... 370/392 |
| 7,500,168 | B2 | * | 3/2009 | Yoshida ........................ 714/752 |
| 7,620,917 | B2 | * | 11/2009 | Tian et al. ......................... 716/1 |
| 7,656,905 | B2 | * | 2/2010 | Sheth et al. ................... 370/503 |
| 2005/0257024 | A1 | * | 11/2005 | Ray et al. ........................ 712/11 |
| 2008/0204072 | A1 | * | 8/2008 | Sasao et al. ..................... 326/38 |

OTHER PUBLICATIONS

Xilinx, Inc.; "Virtex-II Pro Platform FPGA Handbook"; published Oct. 14, 2002; pp. 19-71, available from Xilinx, Inc., 2100 Logic Drive, San Jose, California 95124.

* cited by examiner

*Primary Examiner* — Cheng-Yuan Tseng
(74) *Attorney, Agent, or Firm* — LeRoy D. Maunu

(57) ABSTRACT

Quick key-based ordering of data words is provided. A memory is arranged to receive the keys at an address input port. The memory is adapted to provide at a data output port one of a plurality of ordered sets of identifiers. Each key is associated with a respective one of the data words and each identifier of the one of the ordered sets identifies a respective one of the data words. Each of a plurality of multiplexers is arranged to receive a respective identifier of the one of the ordered sets from the memory and to receive the data words. Each multiplexer is adapted to select the respective one of the data words identified by the respective identifier. A program storage medium may be configured with instructions to perform operations including generating configuration data for a programmable device. The configuration data may implement the memory and the multiplexers.

18 Claims, 6 Drawing Sheets

| Memory address | 316 High priority | 318 Low priority | Memory data | | | |
|---|---|---|---|---|---|---|
| | | | S0 | S1 | S2 | S3 |
| 0 | | 0, 1, 2, 3 | 0 | 1 | 2 | 3 |
| 1 | 0 | 1, 2, 3 | 0 | 1 | 2 | 3 |
| 2 | 1 | 0, 2, 3 | 1 | 0 | 2 | 3 |
| 3 | 0, 1 | 2, 3 | 0 | 1 | 2 | 3 |
| 4 | 2 | 0, 1, 3 | 2 | 0 | 1 | 3 |
| 5 | 0, 2 | 1, 3 | 0 | 2 | 1 | 3 |
| 6 | 1, 2 | 0, 3 | 1 | 2 | 0 | 3 |
| 7 | 0, 1, 2 | 3 | 0 | 1 | 2 | 3 |
| 8 | 3 | 0, 1, 2 | 3 | 0 | 1 | 2 |
| 9 | 0, 3 | 1, 2 | 0 | 3 | 1 | 2 |
| A | 1, 3 | 0, 2 | 1 | 3 | 0 | 2 |
| B | 0, 1, 3 | 2 | 0 | 1 | 3 | 2 |
| C | 2, 3 | 0, 1 | 2 | 3 | 0 | 1 |
| D | 0, 2, 3 | 1 | 0 | 2 | 3 | 1 |
| E | 1, 2, 3 | 0 | 1 | 2 | 3 | 0 |
| F | 0, 1, 2, 3 | | 0 | 1 | 2 | 3 |

*FIG. 3*

CIRCUIT AND METHOD FOR ORDERING DATA WORDS

FIELD OF THE INVENTION

The present invention generally relates to circuits for sorting data words

BACKGROUND

The sorting of data words may provide an ordering of the data words. In one approach, the sorting of data words may order the data words according to the value of the data words. For example, the data words may be sorted in an order that begins with the data word with the smallest value followed by the data word with the second smallest value, and so on. In another approach, each data word may have an associated key and the sorting of the data words may order the data words according to the keys. For example, the data words may be sorted in an order that begins with the data word with the smallest associated key followed by the data word with the second smallest associated key, and so on.

Certain applications, such as high-bandwidth data communication, may require low-latency sorting of a block of data words having associated keys. An application may have a targeted latency for completing the sorting and a targeted throughput bandwidth. Key-based sorting may be accomplished using dedicated circuits; however, these circuits may require a substantial amount of logic. In addition, these circuits may require a number of pipeline stages to achieve the targeted bandwidth and the latency of the pipeline stages may be greater than the targeted latency.

There is a general need for circuits that implement key-based sorting with a low latency and a high bandwidth while reducing the amount of logic required for circuit implementation.

The present invention may address one or more of the above issues.

SUMMARY OF THE INVENTION

Various embodiments of the invention provide a circuit for ordering a plurality of data words. In some embodiments, the circuit includes a memory arranged to receive keys at an address input port. The memory is adapted to provide at a data output port one of a plurality of ordered sets of identifiers. Each key is associated with a respective one of the data words and each identifier of the one of the ordered sets identifies a respective one of the data words. The circuit also includes multiplexers with each multiplexer arranged to receive a respective identifier of the one of the ordered sets from the memory and to receive the data words. Each multiplexer is adapted to select the respective one of the data words identified by the respective identifier.

Various other embodiments of the invention provide a method for ordering a plurality of data words. In some embodiments, one of a plurality of ordered sets of identifiers is read from a location in a memory that is addressed by a plurality of keys. Each key is associated with a respective one of the data words and each identifier of the one of the ordered sets identifies a respective one of the data words. The respective one of the data words identified by each identifier in the one of the ordered sets is selected in parallel, and an order of the identifiers in the one of the ordered sets provides a corresponding order for the data words.

In some embodiments, a program storage medium includes a processor-readable device configured with instructions. Execution of the instructions by one or more processors causes the one or more processors to perform operations including generating configuration data for a programmable logic device. The configuration data implements a memory and multiplexers. The memory is arranged to receive a plurality of keys at an address input port. The memory is adapted to provide at a data output port one of a plurality of ordered sets of identifiers. Each key is associated with a respective one of a plurality of data words and each identifier of the one of the ordered sets identifies a respective one of the data words. Each of the multiplexers is arranged to receive a respective identifier of the one of the ordered sets from the memory and to receive the data words. Each multiplexer is adapted to select the respective one of the data words identified by the respective identifier.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 3 is a table illustrating an example of ordered sets of identifiers that are stored in a memory in accordance with various embodiments of the invention;

DETAILED DESCRIPTION

Figure 1:
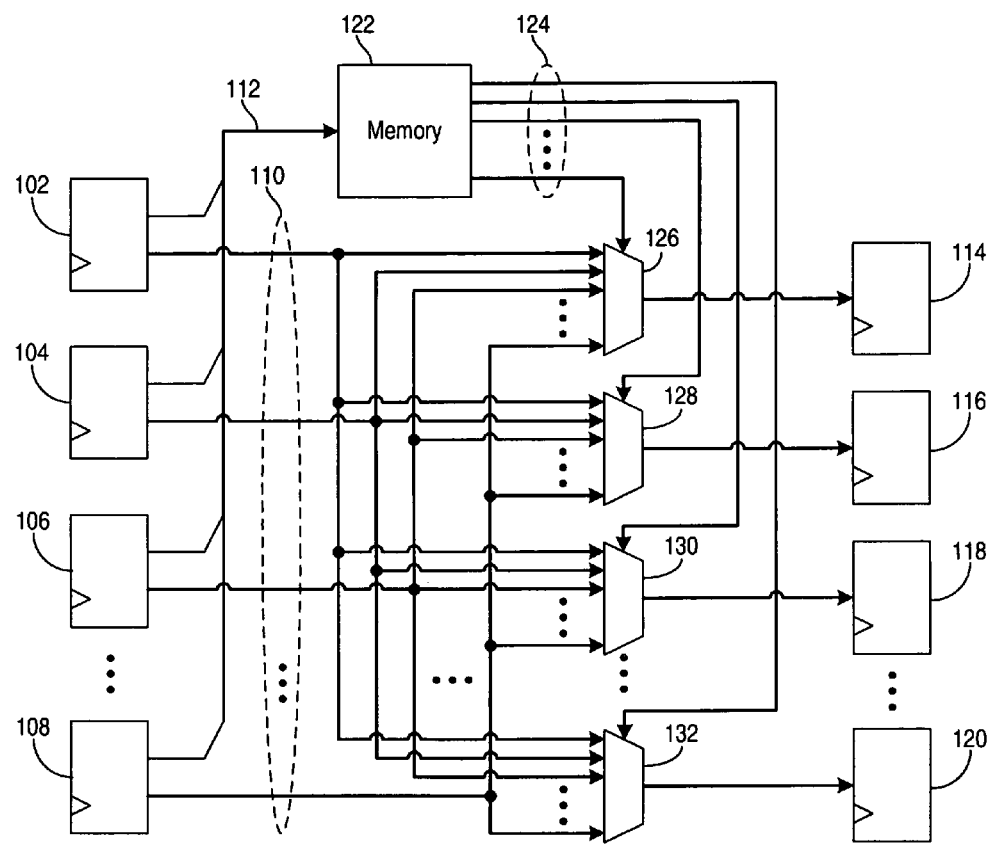
FIG. 1 is a block diagram of a circuit for ordering data words in accordance with various embodiments of the invention.

FIG. 1 is a block diagram of a circuit for ordering data words in accordance with various embodiments of the invention. Each input register 102, 104, 106, and 108 stores a data word together with an associated key. The data words on lines 110 from input registers 102, 104, 106, and 108 are ordered according to the values of the associated keys on line 112 from these input registers and the sorted data words are stored in output registers 114, 116, 118, and 120. The circuit may provide fast parallel ordering of the data words in a single clock cycle. It will be appreciated that the input registers 102, 104, 106, and 108 and/or the output registers 114, 116, 118, and 120 may be omitted in various embodiments.

Each input register 102, 104, 106, and 108 has two fields, a data word and a key. The keys from the input registers 102, 104, 106, and 108 are collectively supplied to an address input port on line 112 of a memory 122. The value addressed by the keys is read from memory 122 and supplied to a data output port on lines 124 of memory 122. The value read from memory 122 is an ordered set of identifiers on lines 124, and each identifier from the ordered set of identifiers on lines 124 identifies a respective data word from one of the input registers 102, 104, 106, and 108. In one embodiment, the data word of input register 102 has an identifier with a value of zero, the data word of input register 104 has an identifier with a value of one, and so on. Generally, the memory 122 contains various permutations of the identifiers of the data words with each identifier appearing exactly once in each permutation. Each permutation provides an ordered set of identifiers with the first identifier of the ordered set identifying which one of the data words on lines 110 is stored in output register 114, the second identifier of the ordered set identifying which one of the data words is stored in output register 116, and so on. Thus, the permutation that is addressed by the keys on line 112 specifies an ordering of the data words on lines 110.

Multiplexer 126 receives a data word from each input register 102, 104, 106, and 108, and selects one of these data words as controlled by a first identifier from the ordered set of identifiers on lines 124. Similarly, multiplexers 128, 130, and 132 each receive the data words on lines 110 from input registers 102, 104, 106, and 108 and select a respective one of these data words as controlled by a corresponding identifier from the ordered set of identifiers on lines 124.

The ordered set of identifiers in memory 122 addressed by a particular value of the keys on line 112 may first include the one or more identifiers of the data words having the associated key with the smallest value, followed by the one or more identifiers of the data words having the associated key with the next smallest value, and so on. For situations in which multiple keys have the same value within the keys on line 112, the ordered set of identifiers may include, within the identifiers of the data words having the associated keys with the same value, first the identifier having the smallest value followed by the identifier having the next smallest value, and so on. Thus, the identifiers of the data words on lines 110 may provide an initial order for these data words. For example, if input registers 104 and 106 have the same value for their respective keys, the data words from input registers 104 and 106 are output in adjacent registers of output registers 114, 116, 118, and 120, and in FIG. 1 the data word from input register 104 is stored in a output register that is above the output register in which the data word from input register 106 is stored. Thus, data words having the same value for the associated keys may appear in the output registers 114, 116, 118, and 120 in the same order that these data words appear in the input registers 102, 104, 106, and 108. Thus, the keys on lines 112 may provide a primary sort key and the order of the input registers 102, 104, 106, and 108 may provide a secondary sort key. In some embodiments, other criteria may be used as the secondary sort key. In other embodiments, the order of data words having the same value for the associated keys may appear in an arbitrary order, such as an order designed to optimize use of memory. It will be appreciated that each ordered set of identifiers may be ordered according to either increasing key values, decreasing key values, or another function of the key values. In addition, the values of the identifiers of the data words of input registers 102, 104, 106, and 108 may be arbitrary unique values.

In certain embodiments, the memory 122 is a read-only memory, and in certain other embodiments, the memory 122 is a read-write memory. Generally, the memory 122 may be initialized with the ordered sets of identifiers. It will be appreciated that in certain embodiments the key associated with a data word may be the data word itself, such that the data words on lines 110 may be the keys on line 112. In addition, the key associated with a data word may be a portion of the data word, such as a field of the data word. In other embodiments the key may have another relationship to the data word, such as keys that are functions of their respective data words.

Figure 2:
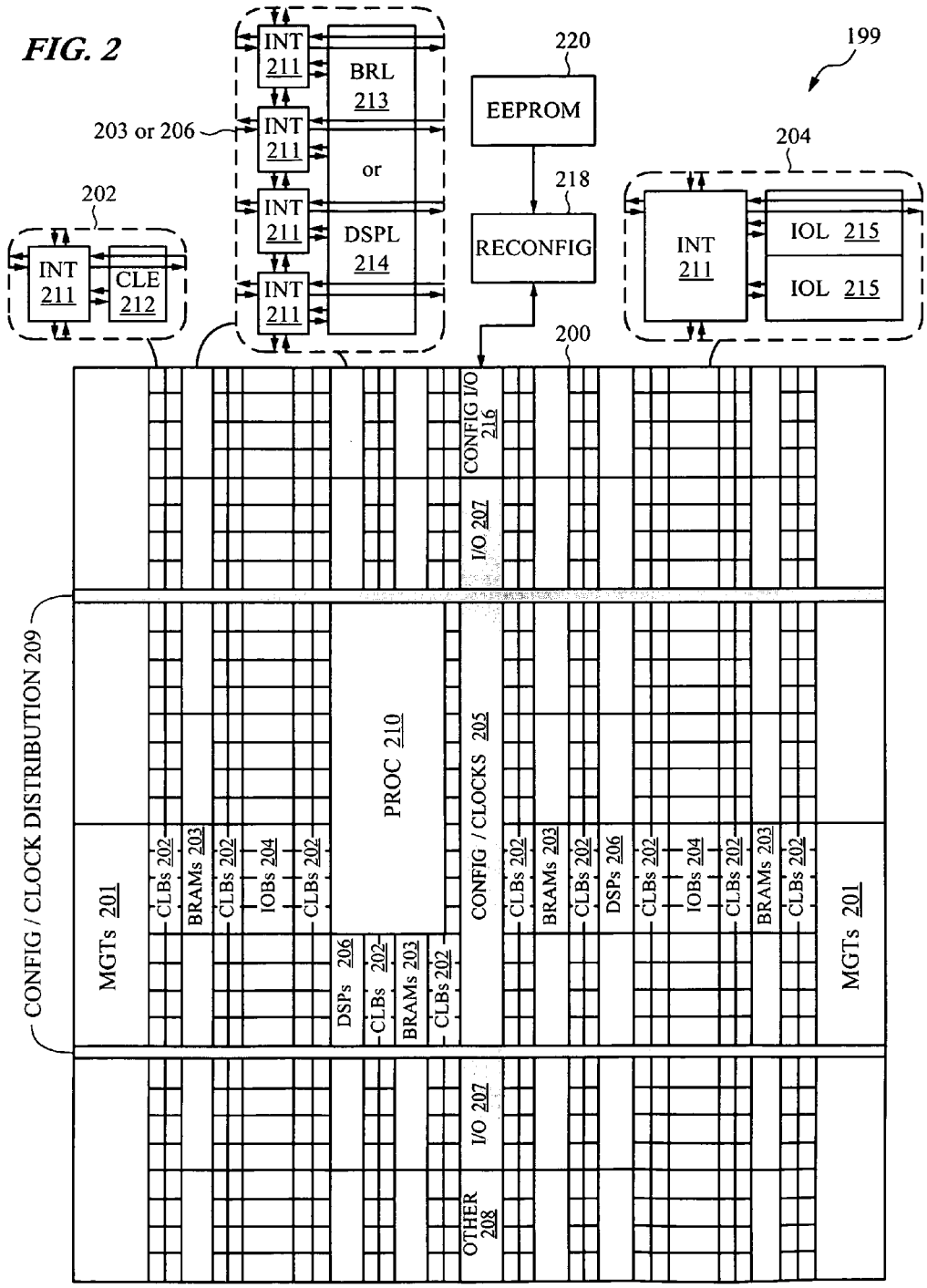
FIG. 2 is a block diagram of a PLD arrangement that may implement ordering of data words in accordance with various embodiments of the invention.

FIG. 2 is a block diagram of a PLD arrangement 199 that may implement ordering of data words in accordance with various embodiments of the invention. The PLD 200 may be programmed with configuration data from the EEPROM 220 during reset of the PLD 200. The configuration data may program the PLD 200 to implement ordering of data words together with various other functions. Reconfiguration circuit 218 may modify the configuration data within PLD 200 via configuration I/O port 216 and associated configuration logic to change the implemented ordering of data words. For example, the ordering of data words may be changed to reverse the ordering.

Certain PLDs, such as advanced FPGAs, may include an array of programmable tiles having several different types of programmable memory, logic, and routing resources. For example, FIG. 2 illustrates a PLD 200 with an FPGA architecture that includes a large number of different programmable tiles including multi-gigabit transceivers (MGTs 201), configurable logic blocks (CLBs 202), random access memory blocks (block RAMs or BRAMs 203), input/output blocks (IOBs 204), configuration and clocking logic (CONFIG/CLOCKS 205), digital signal processing blocks (DSPs 206), specialized input/output blocks (I/O 207) (e.g., clock ports), configuration I/O port 216, and other programmable logic 208 such as digital clock managers, analog-to-digital converters, system monitoring logic, and so forth. Some FPGAs also include one or more dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 may include a configurable logic element (CLE 212) that may be programmed to implement user logic plus a single programmable interconnect element (INT 211). A BRAM 203 may include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 206 may include a DSP logic element (DSPL 214) in addition to an appropriate number of programmable interconnect elements. An IOB 204 may include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Configuration data from EEPROM 220 may be loaded into configuration memory cells in the programmable memory, logic, and routing resources 201, 202, 203, 204, 206, and 208 via configuration I/O port 216, CONFIG/CLOCKS 205, and the configuration distribution signals of areas 209.

Some FPGAs utilizing the architecture illustrated in FIG. 2 include additional logic blocks that disrupt the regular columnar structure making up a large part of the FPGA. The additional logic blocks may be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

One such FPGA, the Xilinx Virtex-II Pro FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124, which pages are incorporated herein by reference.

In one embodiment, programmable memory resources, such as one or more of BRAMs 203, is a memory, corresponding to memory 122 of FIG. 1, programmed to store an ordered set of identifiers. The BRAM may be programmed using configuration data from EEPROM 220 as either a read-only or a read-write memory, and the programming of the BRAM may include initializing the contents of the BRAM with the ordered set of identifiers. The PLD 200 may also be programmed to implement the multiplexers 126, 128, 130, and 132 of FIG. 1 in programmable logic resources, such as certain of CLEs 212, and programmable routing resources, such as certain of interconnect elements 211.

FIG. 3 is a table illustrating an example of ordered sets of identifiers that are stored in a memory in accordance with various embodiments of the invention. The example ordered sets of identifiers may be used to sort four data words each having an associated 1-bit key, with a value of 0 for the 1-bit key indicating the data word has low priority and a value of 1 for the 1-bit key indicating the data word has high priority. The four data words each have a 2-bit unique identifier with values of 0, 1, 2, and 3, respectively.

Column 302 is the memory address that receives the four 1-bit keys associated with the four data words. Thus, the memory address is a 4-bit address having the possible hexadecimal values shown in column 302.

Column 304 shows the contents of the memory at the memory addresses given by column 302. The contents of column 304 are ordered sets of identifiers, with each identifier of each ordered set identifying one of the four data words. Each row within column 304 is an ordered set of identifiers, with the entry in column 306 for the row being the first identifier in the ordered set, the entry in column 308 for the row being the second identifier in the ordered set, the entry in column 310 for the row being the third identifier in the ordered set, and the entry in column 312 for the row being the fourth and last identifier in the ordered set. Because each ordered set of identifiers in a row of column 304 includes four 2-bit identifiers, a total of 8 bits is stored at each address of the memory.

Each memory address in column 302 corresponds to four 1-bit key values. For example in row 314, the memory address in column 302 corresponds to the key values of high-priority for the data word with identifier 0 as shown in column 316 and low priority for the data words with identifiers 1, 2, and 3 as shown in column 318. Because the ordering has the high-priority data words ordered before the low-priority data words, the identifier 0 appears first in column 304 at column 306 and the identifiers 1, 2, and 3 follow in columns 308, 310, and 312.

For example in row 320, the memory address in column 302 corresponds to the key values of high-priority for the data words with identifiers 0 and 3 as shown in column 316 and low priority for the data words with identifiers 1 and 2 as shown in column 318. The identifiers 0 and 3 for the high-priority data words appear first in column 304 at columns 306 and 308, followed by the identifiers 1 and 2 for the low-priority data words at columns 310 and 312. Because identifiers 0 and 3 have the same key value of high priority, these identifiers are included in column 304 ordered according to the value of the identifier with identifier 0 having the smaller value at column 306, followed by identifier 3 having the larger value at column 308. Identifiers 1 and 2 are similarly ordered because these identifiers have the same key value of low priority. Thus, the key value provides a primary sort key and the identifier value provides a secondary sort key.

In other embodiments, the number of data words, the number of keys, the number of identifiers in each ordered set, and the number of multiplexers are all equal to a particular number n, which may be any arbitrary number (including a number other than four), and the number of ordered sets of identifiers in the memory (which may correspond, for example, to the number of rows in the memory) is two to the power of the particular number ($2^n$). The number of bits in each identifier may be the base-two logarithm of the particular number ($\log_2 n$). Thus the total memory needed may be $2^n \times n \log_2 n$ bits, organized as $2^n$ rows of $n \log_2 n$ bits.

For example, the particular number may be eight (n=8) for eight data words, eight keys, eight identifiers in each ordered set, eight multiplexers, and two to the power of eight, i.e., 256, ordered sets of identifiers in the memory. Each identifier may have the base-two logarithm of eight, i.e., 3, bits. In addition, each key may be a 1-bit key and each data word may be an 8-bit data word. The 1-bit key may determine whether the associated data word has low priority or high priority. Such an ordering of data words may be used to order blocks of data words according to the Generic Framing Procedure.

In networking applications, a received stream of data words may need to be separated or sorted into information bytes and control bytes. For example, the Generic Framing Procedure (GFP) telecommunication protocol for encapsulating data onto SONET/SDH has 9-bit words including a 1-bit type field and an 8-bit field for data words, which may be either a standard information byte or a control byte depending upon the value of the 1-bit type field. A value of zero for the 1-bit type field indicates the 8-bit data field is an information byte and a value of one for the 1-bit type field indicates the 8-bit data field is a control byte. GFP specifies that blocks of eight of the 8-bit data words, each 8-bit data word having an associated 1-bit type field, should be sorted to have the 8-bit data words that are control bytes precede the 8-bit data words that are information bytes.

In certain embodiments, blocks of eight 8-bit data words are ordered according to GFP to have the control bytes, if any, precede the information bytes. In one embodiment, a PLD may be programmed to implement parallel sorting of blocks of data words according to GFP with an implementation that operates at high data rates and provides low latency and low utilization of PLD memory, logic, and routing resources. A BRAM of the PLD may for example include 18 Kbytes of storage programmed or configured to implement a memory having 512 entries each having 36 bits. The eight 1-bit type fields for the block may be combined to form an 8-bit address (from the eight 1-bit keys) that is input to a 9-bit address port of the BRAM together with tying one address bit, such as the most significant bit, of the address port to a constant value, such as zero. In some embodiments, the extra address bit may be used to divide the memory into two portions, for example where each half of the memory may be initialized to different ordered sets of identifiers and the extra bit used to switch between the sets. Each entry in the lower half of the memory includes an ordered set of eight identifiers with each identifier having 3 bits, for a total of 24 bits. Of the 36 bits output at a data output of the BRAM, 24 bits are the ordered set of identifiers that is addressed by the address port of the BRAM, and the other 8 bits may be left unconnected (e.g., as "don't care" values). The PLD may also be programmed to implement eight multiplexers in the programmable logic and routing resources of the PLD, with each multiplexer having eight 8-bit inputs for the data words and a 3-bit control or select input for selecting one of the 8-bit inputs as an 8-bit output, where the select input may be controlled by a respective one of the 3-bit identifiers from the data output of the BRAM. The ordering of the data words according to GFP may be implemented in an FPGA from Xilinx, Inc. using one BRAM and 64 CLBs, because one CLB may implement an 8-bit to 1-bit multiplexer.

Figure 4:
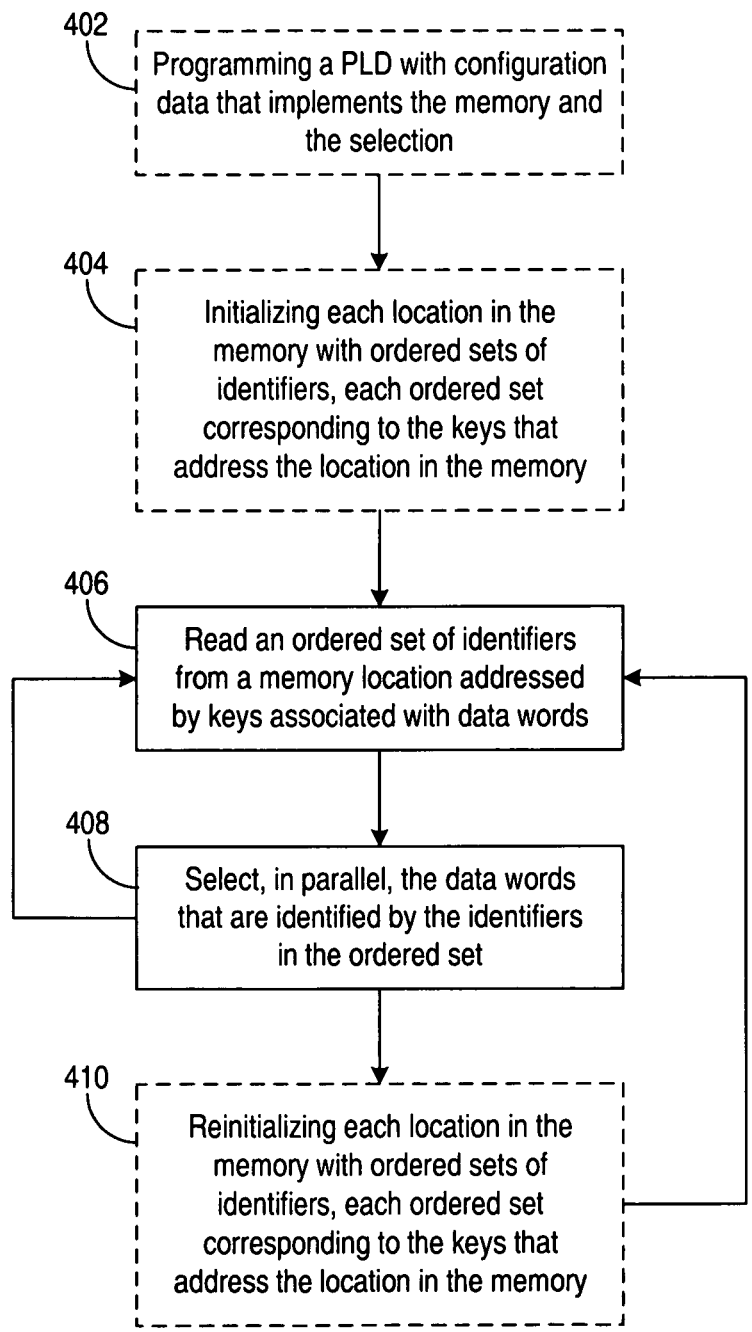
FIG. 4 is a flow diagram of a process for ordering data words in accordance with various embodiments of the invention.

FIG. 4 is a flow diagram of a process for ordering data words in accordance with various embodiments of the invention. At optional step 402, a programmable logic device (PLD) is programmed with configuration data that implements the memory and the selection. At optional step 404, each location in the memory is initialized with a respective ordered set of identifiers corresponding to the keys that address the location.

At step 406, an ordered set of identifiers is read from a memory location addressed by keys associated with the data words. Each data word has an associated key and each identifier in the ordered set of identifiers identifies a respective one of the data words. At step 408, the data words are selected, in parallel, in an order corresponding to the order specified by the ordered set of identifiers read from the memory.

At optional step 410, each location in the memory is reinitialized with another respective ordered set of identifiers corresponding to the keys that address the location, with each identifier identifying a respective one of the data words. This would, for example, allow for the use of alternate ordered sets with different orderings. In other embodiments, this could allow for changes in the data words and/or the associated keys.

Figure 5:
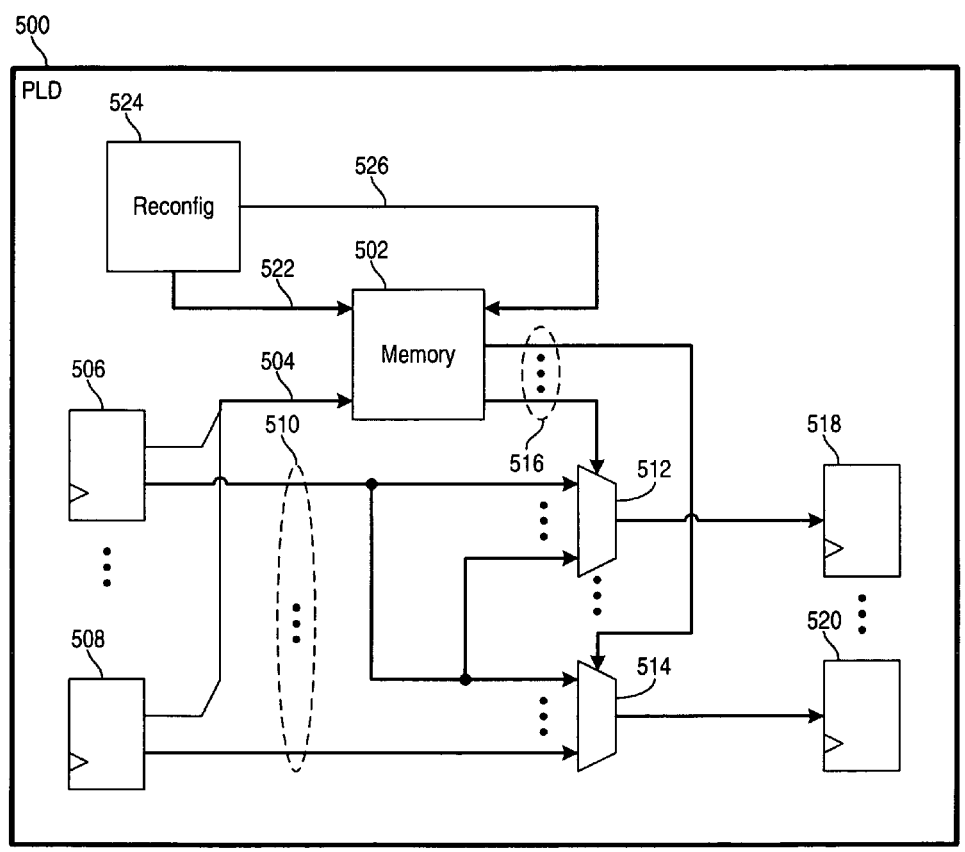
FIG. 5 is a block diagram of a PLD implementing reconfigurable ordering of data words in accordance with various embodiments of the invention.

FIG. 5 is a block diagram of a PLD 500 implementing reconfigurable ordering of data words in accordance with various embodiments of the invention. FIG. 5 illustrates user logic implemented in a PLD 500 after programming the PLD with configuration data.

A memory 502 receives keys on line 504 from input registers 506 through 508, with a key received from each input register 506 through 508. Each of input registers 506 through 508 also provides data words on lines 510 to multiplexers 512 through 514. The memory outputs an ordered set of identifiers on lines 516 including an identifier of each of the data words on lines 510 in an order corresponding to the keys on line 504. The multiplexers 512 through 514 output an ordering of the data words that is stored in output registers 518 through 520.

Memory 502 may be a dual port memory, with one port being a read port addressed by the keys on line 504 and outputting an ordered set of identifiers on lines 516, and the other port being a write port addressed at the address input port on line 522 by a reconfiguration circuit 524 that may write an alternative set of identifiers to the memory 502 using the data input port on line 526. The reconfiguration circuit 524 may update the ordered sets of identifiers stored in memory 502 to modify the ordering of data words performed by PLD 500.

In one embodiment, the PLD is programmed with configuration data that implements the reconfiguration circuit 524 in the programmable memory, logic, and routing resources of the PLD. In another embodiment, the reconfiguration circuit 524 is a processor programmed to execute software providing a reconfiguration procedure and possibly other procedures. The processor may be a dedicated circuit of PLD 500, or PLD 500 may be programmed to implement the processor in the programmable memory, logic, and routing resources of the PLD.

Figure 6:
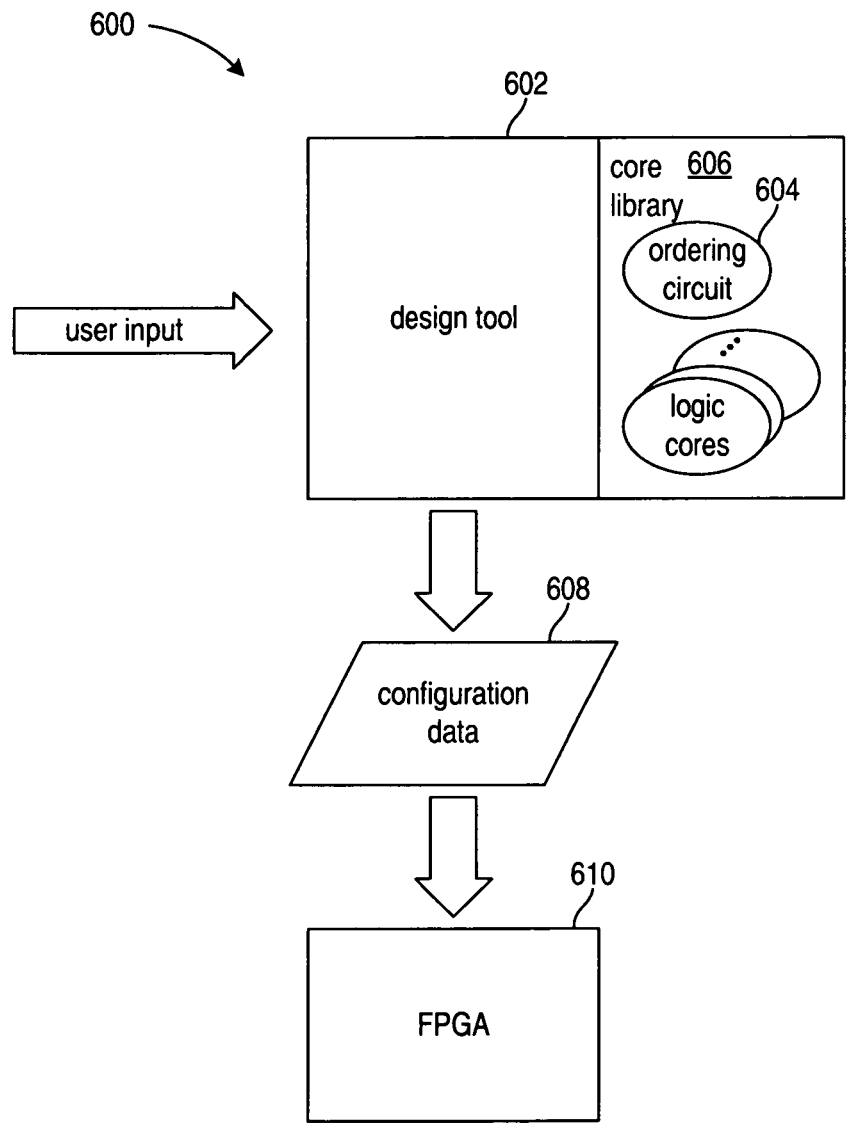
FIG. 6 illustrates an example arrangement in which an ordering circuit having the characteristics and capabilities described herein may be implemented in accordance with various embodiments of the invention.

FIG. 6 illustrates an example arrangement 600 in which an ordering circuit having the characteristics and capabilities described herein may be implemented on an FPGA such as the example FPGA of FIG. 2. Those skilled in the art will recognize that an electronic design tool 602 (or set of tools), such as the System Generator tool from Xilinx, may make a parameterizable logic core available to a designer. The logic core is available to a designer for combining with other logic of a design, and the designer may specify parameter values that are suitable for the particular application.

In one embodiment, the ordering circuit is included in a logic core 604, such as a communication interface core that implements the Generic Framing Procedure (GFP) telecommunication protocol, and logic core 604 may be one of many logic cores available in a core library 606 that is accessible to a user via the design tool 602. The design tool also provides the capability to generate configuration data 608 from the assembled logic cores and other design objects. The configuration data may then be loaded into the FPGA 610 to implement a circuit ordering data words as described herein. Those skilled in the art will recognize that the logic core 604, either alone, or in combination with the executable instructions of a design tool(s) for implementing the ordering of data words, may be provided via a variety of computer-readable media or delivery channels such as magnetic or optical disks or tapes, electronic storage devices, or downloaded over a network. In addition, various alternative computing arrangements, including one or more processors and a memory arrangement configured with program code, would be suitable for hosting the design tool.

Various embodiments of the present invention are described in terms of ordering of data words. Those skilled in the art will appreciate that the invention could be implemented in other programming languages, applied to programmable logic devices (PLDs) other than FPGAs, and/or adapted to applications.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for ordering data words. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit for ordering a plurality of data words, comprising:
   a memory arranged to receive a plurality of keys at an address input port, the memory adapted, responsive to the plurality of keys collectively supplied to the address input port, to provide at a data output port one ordered set of a plurality of ordered sets of identifiers,
   wherein the memory is configured with the plurality of ordered sets of identifiers, and each ordered set of identifiers is a permutation of a plurality of the identifiers,
   wherein each key is associated with a respective one of the data words and each identifier of the one ordered set of the plurality of ordered sets identifies a respective one of the data words; and
   a plurality of multiplexers corresponding to the plurality of data words, respectively, each multiplexer arranged to receive at a select input of the multiplexer, a respective identifier of the one ordered set of the plurality of ordered sets from the memory and to receive the data words at respective inputs of the multiplexer,
   wherein each multiplexer is adapted to select the respective one of the data words identified by the respective identifier, and
   wherein the plurality of data words is 8 data words, each data word having 8 bits, the plurality of keys is 8 keys, each key having one bit, the plurality of ordered sets of identifiers is 256 ordered sets of identifiers, each ordered set of identifiers having 8 identifiers, each identifier having 3 bits, and the plurality of multiplexers is 8 multiplexers.

2. The circuit of claim 1, further comprising a reconfiguration circuit adapted to update the plurality of ordered sets of identifiers.

3. The circuit of claim 2, wherein the reconfiguration circuit is adapted to update the plurality of ordered sets of identifiers in the memory using another address input port and a data input port of the memory.

4. The circuit of claim 2, wherein the memory is implemented in programmable memory resources of a programmable logic device (PLD).

5. The circuit of claim 4, wherein at least a portion of the reconfiguration circuit is implemented in programmable memory, logic, and routing resources of the PLD.

6. The circuit of claim 4, wherein the reconfiguration circuit comprises a processor of the PLD, the processor adapted to execute reconfiguration software that updates the plurality of ordered sets of identifiers.

7. The circuit of claim 1, wherein the memory and the multiplexers are implemented in programmable memory, logic, and routing resources of a programmable logic device (PLD).

8. The circuit of claim 7, wherein the memory comprises a block RAM of the PLD.

9. The circuit of claim 1, wherein for each of the plurality of ordered sets of identifiers in the memory, an order in the ordered set of the identifiers of the data words that have identical associated keys corresponds to an order of the data words.

10. The circuit of claim 1, wherein each key has one of a first value and a second value, the first value different from the second value.

11. The circuit of claim 10, wherein for each of the plurality of ordered sets of identifiers in the memory, an order of the identifiers in the ordered set is the identifiers that identify the data words having the first value for the associated key followed by the identifiers that identify the data words having the second value for the associated key.

12. The circuit of claim 11, wherein the order of the identifiers in the ordered set is the identifiers that identify the data words having the first value for the associated key in an order for the data words followed by the identifiers that identify the data words having the second value for the associated key in the order for the data words.

13. The circuit of claim 1, wherein the data words are selected by the multiplexers responsive to the memory according to the Generic Framing Procedure for ordering a block of control and information bytes.

14. A method for ordering a plurality of data words, comprising:
   reading one ordered set of a plurality of ordered sets of identifiers from a location in a memory that is addressed by a plurality of keys that are collectively supplied to an address input port of the memory,
   wherein the memory is configured with the plurality of ordered sets of identifiers, and each ordered set of identifiers is a permutation of a plurality of the identifiers,
   wherein each key is associated with a respective one of the data words and each identifier of the one ordered set of the plurality of ordered sets identifies a respective one of the data words; and
   performing by a plurality of multiplexers corresponding to the plurality of data words, respectively, parallel selections of the data words identified by the one ordered set of the plurality of ordered sets,
   wherein each selection is made by a respective one of the multiplexers responsive to a respective identifier of the one ordered set read from the memory, and
   wherein an order of the identifiers in the one ordered set of the plurality of ordered sets provides a corresponding order for the data words, and
   wherein the plurality of data words is 8 data words, each data word having 8 bits, the plurality of keys is 8 keys, each key having one bit, the plurality of ordered sets of identifiers is 256 ordered sets of identifiers, each ordered set of identifiers having 8 identifiers, each identifier having 3 bits, and the plurality of multiplexers is 8 multiplexers.

15. The method of claim 14, further comprising programming a programmable logic device (PLD) with configuration data that implements the memory and the selecting.

16. The method of claim 14, further comprising initializing each location in the memory with a respective ordered set of identifiers corresponding to the keys that address the location.

17. The method of claim 16, further comprising reinitializing each location in the memory with another respective ordered set of identifiers corresponding to the keys that address the location.

18. A program storage medium, comprising:
   a processor-readable device configured with instructions, wherein execution of the instructions by one or more processors causes the one or more processors to perform operations including generating configuration data for a programmable device, wherein the configuration data implements,
   a memory arranged to receive a plurality of keys at an address input port, the memory adapted, responsive to the plurality of keys collectively supplied to the address input port, to provide at a data output port one ordered set of a plurality of ordered sets of identifiers, wherein the memory is configured with the plurality of ordered sets of identifiers, and each ordered set of identifiers is a permutation of a plurality of the identifiers, wherein each key is associated with a respective one of a plurality of data words and each identifier of the one ordered set of the plurality of ordered sets identifies a respective one of the data words; and a plurality of multiplexers corresponding to the plurality of data words, respectively, each multiplexer arranged to receive at a select input of the multiplexer, a respective identifier of the one ordered set of the plurality of ordered sets from the memory and to receive the data words at respective inputs of the multiplexer, wherein each multiplexer is adapted to select the respective one of the data words identified by the respective identifier, and wherein the plurality of data words is 8 data words, each data word having 8 bits, the plurality of keys is 8 keys, each key having one bit, the plurality of ordered sets of identifiers is 256 ordered sets of identifiers, each ordered set of identifiers having 8 identifiers, each identifier having 3 bits, and the plurality of multiplexers is 8 multiplexers.

\* \* \* \* \*